(12) United States Patent
Hung et al.

(10) Patent No.: US 11,955,417 B2
(45) Date of Patent: Apr. 9, 2024

(54) ELECTRONIC DEVICE HAVING SUBSTRATE WITH ELECTRICALLY FLOATING VIAS

(71) Applicant: INDUSTRIAL TECHNOLOGY RESEARCH INSTITUTE, Hsinchu (TW)

(72) Inventors: Tsung-Yi Hung, Zhubei (TW); Shih-Hsien Wu, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 208 days.

(21) Appl. No.: 17/550,602

(22) Filed: Dec. 14, 2021

(65) Prior Publication Data
US 2023/0187332 A1 Jun. 15, 2023

(51) Int. Cl.
*H01L 23/498* (2006.01)
*H01L 23/00* (2006.01)

(52) U.S. Cl.
CPC .. *H01L 23/49827* (2013.01); *H01L 23/49816* (2013.01); *H01L 23/49822* (2013.01); *H01L 23/49838* (2013.01); *H01L 24/16* (2013.01); *H01L 2224/16227* (2013.01)

(58) Field of Classification Search
CPC ......... H01L 23/49827; H01L 23/49816; H01L 23/49822; H01L 23/49838; H01L 24/16
See application file for complete search history.

(56) References Cited

U.S. PATENT DOCUMENTS

| 8,237,278 | B2 | 8/2012 | Gluschenkov |
| 8,269,350 | B1 * | 9/2012 | Chen ................. H01L 23/49827 257/734 |
| 9,437,561 | B2 | 9/2016 | Black |

(Continued)

FOREIGN PATENT DOCUMENTS

| CN | 110767613 A | 2/2020 |
| TW | 201222768 A | 6/2012 |

(Continued)

OTHER PUBLICATIONS

TW Office Action dated Jun. 8, 2023 as received in Application No. 111125675.

*Primary Examiner* — Michael Jung
(74) *Attorney, Agent, or Firm* — Maschoff Brennan

(57) ABSTRACT

An electronic device includes a substrate, an upper conductive layer, and a lower conductive layer. The substrate has a plurality of inner vias and has an upper surface and a lower surface. The upper conductive layer includes an upper ground trace and an upper signal pad disposed on the upper surface. The upper ground trace is electrically connected to the ground vias and has an upper hollow portion exposing a part of the upper surface. The upper signal pad is disposed on the part of the upper surface exposed by the upper hollow portion and electrically connected to the signal via. The lower conductive layer includes a lower ground trace and a lower signal pad disposed on the lower surface. The lower conductive trace is electrically connected to the ground vias and has a lower hollow portion exposing a part of the lower surface. The lower signal pad is disposed on the part of the lower surface exposed by the lower hollow portion and electrically connected to the signal via.

19 Claims, 10 Drawing Sheets

(56) References Cited

U.S. PATENT DOCUMENTS

| | | | |
|---|---|---|---|
| 2008/0272794 A1 | 11/2008 | Grube | |
| 2012/0217625 A1 | 8/2012 | Mohan et al. | |
| 2019/0306975 A1 | 10/2019 | Kho | |
| 2019/0312067 A1 | 10/2019 | Garner | |
| 2020/0066640 A1 | 2/2020 | Sarkar | |
| 2021/0327830 A1* | 10/2021 | Lee | H01L 23/642 |
| 2022/0208646 A1* | 6/2022 | Low | H01L 23/552 |

FOREIGN PATENT DOCUMENTS

| | | |
|---|---|---|
| TW | I629762 B | 7/2018 |
| TW | 202133699 A | 9/2021 |

\* cited by examiner

ELECTRONIC DEVICE HAVING SUBSTRATE WITH ELECTRICALLY FLOATING VIAS

TECHNICAL FIELD

The disclosure relates to an electronic device having a substrate with an array of vias.

BACKGROUND

An electronic device may have a substrate with vias made conductive for electrically connecting to one or more electrical components mounted thereon. The via provides a conductive path for passing an electrical signal to the electrical component that it electrically connects with.

In recent years, the demand for high-frequency transmission in shorter time period has significantly increased. It is known that when the impedance mismatches along the signal path will cause signal reflection, thereby resulting in signal distortion and affecting the integrity of signal. These issues will become severer when in a high-frequency signal system.

SUMMARY

One embodiment of the disclosure provides an electronic device including a substrate, an upper conductive layer, and a lower conductive layer. The substrate has a plurality of inner vias. The inner vias includes a plurality of ground vias, at least one signal via, and a plurality of floating vias. The substrate has an upper surface and a lower surface. The upper conductive layer includes an upper ground trace and at least one upper signal pad. The upper ground trace is disposed on the upper surface. The upper ground trace is electrically connected to at least one plurality of the ground vias. The upper ground trace has at least one upper hollow portion. The upper hollow portion exposes a part of the upper surface. The upper signal pad is disposed on the part of the upper surface exposed by the upper hollow portion. The upper signal pad is electrically connected to the signal via. The lower conductive layer includes a lower ground trace and at least one lower signal pad. The lower ground trace is disposed on the lower surface. The lower ground trace is electrically connected to at least one plurality of the ground vias. The lower ground trace has at least one lower hollow portion. The lower hollow portion exposes a part of the lower surface. The lower signal pad is disposed on the part of the lower surface exposed by the lower hollow portion. The lower signal pad is electrically connected to the signal via. The floating vias are electrically insulated from the upper conductive layer and the lower conductive layer and electrically floating.

The above description about the content of the disclosure and the following description about the embodiments are used to demonstrate and explain the spirit and principle of the disclosure and provide a further explanation of the scope of claims of the disclosure.

BRIEF DESCRIPTION OF THE DRAWINGS

The disclosure will become better understood from the detailed description given hereinbelow and the accompanying drawings which are given by way of illustration only and thus are not intending to limit the disclosure and wherein.

DETAILED DESCRIPTION

Figure 1:
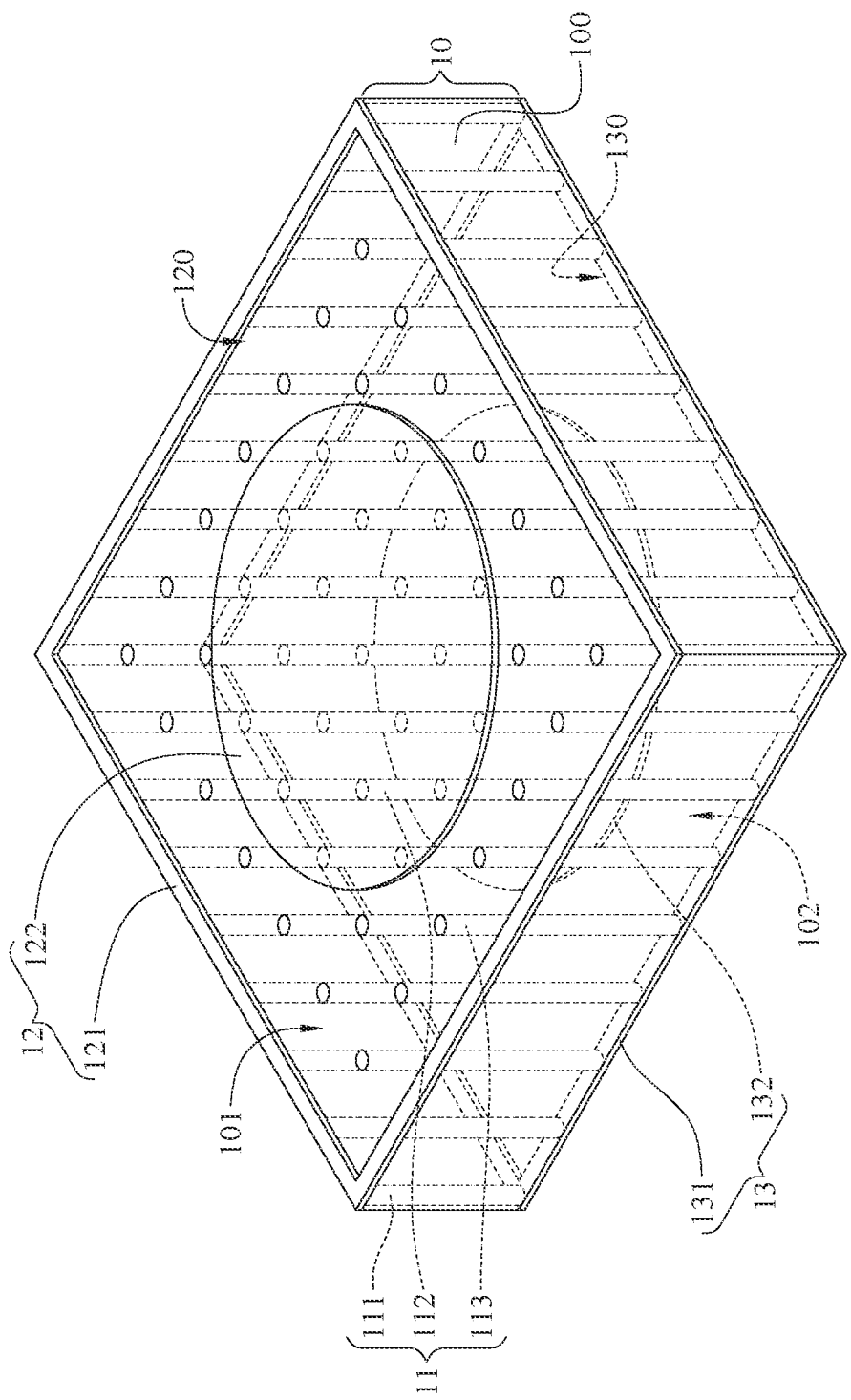
FIG. 1 illustrates a schematic three-dimensional view of an electronic device having a substrate according to one embodiment of the disclosure.

Features and advantages of embodiments of the disclosure are described in the following detailed description, it allows the person skilled in the art to understand the technical contents of the embodiments of the disclosure and implement them, and the person skilled in the art can easily comprehend the purposes of the advantages of the disclosure. The following embodiments are further illustrating the perspective of the disclosure, but not intending to limit the disclosure.

The drawings may not be drawn to actual size or scale, some exaggerations may be necessary in order to emphasize basic structural relationships, while some are simplified for clarity of understanding, and the disclosure is not limited thereto. It is allowed to have various adjustments under the spirit of the disclosure. In addition, the spatially relative terms, such as "up", "top", "above", "down", "low", "left", "right", "front", "rear", and "back" and the like, may be used herein for ease of description to describe the relationship of one element or feature to another element(s) of feature(s) as illustrated in the drawings. It will be understood that the spatially relative terms are intended to encompass orientations of the element or feature but not intended to limit the disclosure.

Figure 2:
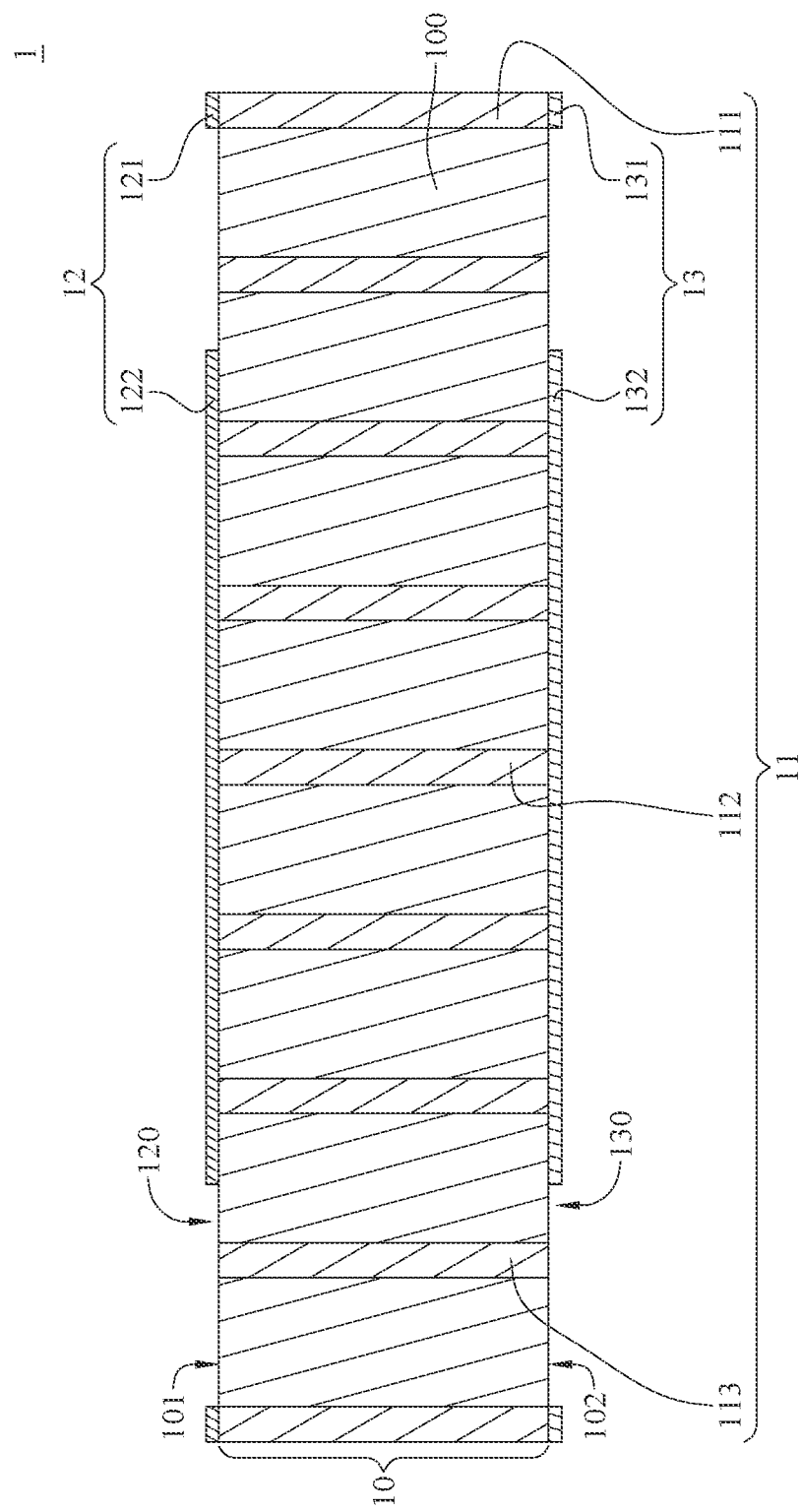
FIG. 2 illustrates a schematic cross-sectional view of the substrate in FIG. 1.

Please refer to FIG. 1 and FIG. 2. FIG. 1 illustrates a schematic three-dimensional view of an electronic device having a substrate according to one embodiment of the disclosure. FIG. 2 illustrates a schematic cross-sectional view of the substrate in FIG. 1.

As shown in FIG. 1 and FIG. 2, in the embodiment, the electronic device 1 includes a substrate 10, an upper conductive layer 12, and a lower conductive layer 13. The substrate 10 includes a core layer 100 and a plurality of inner vias 11. The core layer 100 is made of a material selected from a group consisting of a semiconductor material and a non-conductive material. In particular, the core layer 100 is made of a material selected from a group consisting of silicon, gallium, germanium, gallium nitride, and epoxy resin. The inner vias 11 pass through the core layer 100 and are arranged in a rectangular array. Each of the inner vias 11 is solid. Each of the inner vias 11 has an outer diameter ranging approximately from 5 µm to 100 µm. A distance between centers of two of the inner vias 11 adjacent to each other is in micrometer scale. The inner vias 11 include a plurality of ground vias 111, a plurality of signal vias 112, and a plurality of floating vias 113. The floating vias 113 are electrically insulated from the upper conductive layer 12 and the lower conductive layer 13 and electrically floating.

The substrate 10 has an upper surface 101 and a lower surface 102. The upper conductive layer 12 includes an upper ground trace 121 and an upper signal pad 122. The upper ground trace 121 is disposed on the upper surface 101. The upper ground trace 121 is electrically connected to the ground vias 111. The upper ground trace 121 has an upper hollow portion 120. The upper hollow portion 120 exposes a part of the upper surface 101. In other words, the upper hollow portion 120 does not cover the part of the upper surface 101. The upper signal pad 122 is disposed on the part of the upper surface 101 exposed by the upper hollow portion 120. In other words, the upper signal pad 122 is disposed on the part of the upper surface 101 not covered by the upper hollow portion 120. The upper signal pad 122 is electrically connected to more than one of the signal vias 112 in a one-to-plurality manner. In other words, the upper signal pad 122 is electrically connected to at least two of the signal vias 112. The upper signal pad 122 is separated from the upper ground trace 121, and thus the upper signal pad 122 is electrically insulated from the upper ground trace 121.

The lower conductive layer 13 includes a lower ground trace 131 and a lower signal pad 132. The lower ground trace 131 is disposed on the lower surface 102. The lower ground trace 131 is electrically connected to the ground vias 111. The lower ground trace 131 has a lower hollow portion 130. The lower hollow portion 130 exposes a part of the lower surface 102. The lower signal pad 132 is disposed on the part of the lower surface 102 exposed by the lower hollow portion 130. The lower signal pad 132 is electrically connected to more than one of the signal vias 112 in a one-to-plurality manner. The lower signal pad 132 is separated from the lower ground trace 131, and thus the lower signal pad 132 is electrically insulated from the lower ground trace 131.

In the embodiment, the upper hollow portion 120 and the lower hollow portion 130 expose the floating vias 113. In other words, the floating vias 113 are not covered by the upper hollow portion 120 and the lower hollow portion 130. A number and a density of the floating vias 113 may affect an impedance when a signal is transmitted through the upper signal pad 122, the signal vias 112, and the lower signal pad 132.

In the embodiment, a shape of the upper hollow portion 120 is the same as a shape of the lower hollow portion 130. As shown, the upper hollow portion 120 and the lower hollow portion 130 may be both in a square shape. Moreover, a size of the upper hollow portion 120 is the same as a size of the lower hollow portion 130. All of the ground vias 111 are electrically connected to the upper ground trace 121 and the lower ground trace 131. The disclosure is not limited thereto. In another embodiment, the shape or the size of the upper hollow portion 120 may be designed to be different from the shape or the size of the lower hollow portion 130 for the purpose of impedance matching. In addition, in another embodiment, the ground vias 111 may be only electrically connected to the upper ground trace 121 or only electrically connected to the lower ground trace 131.

In the embodiment, a shape of the upper signal pad 122 is the same as a shape of the lower signal pad 132. As shown, the upper signal pad 122 and the lower signal pad 132 may be both in a circle shape. Moreover, a size of the upper signal pad 122 is the same as a size of the lower signal pad 132. All of the signal vias 112 are electrically connected to the upper signal pad 122 and the lower signal pad 132.

In the embodiment, the smaller the size of the upper signal pad 122 and the larger the size of the upper hollow portion 120 are, the larger the equivalent impedance near the upper signal pad 122 is. The larger the size of the upper signal pad 122 and the smaller the size of the upper hollow portion 120 are, the smaller the equivalent impedance near the upper signal pad 122 is.

Moreover, the smaller the size of the lower signal pad 132 and the larger the size of the lower hollow portion 130 are, the larger the equivalent impedance near the lower signal pad 132 is. The larger the size of the lower signal pad 132 and the smaller the size of the lower hollow portion 130 are, the smaller the equivalent impedance near the lower signal pad 132 is.

Furthermore, in another embodiment, a plurality of the electronic devices 1 may be arranged in an array and connected to each other. The adjacent electronic devices 1 may share the upper ground traces 121 and the lower ground traces 131 with each other.

Figure 3:
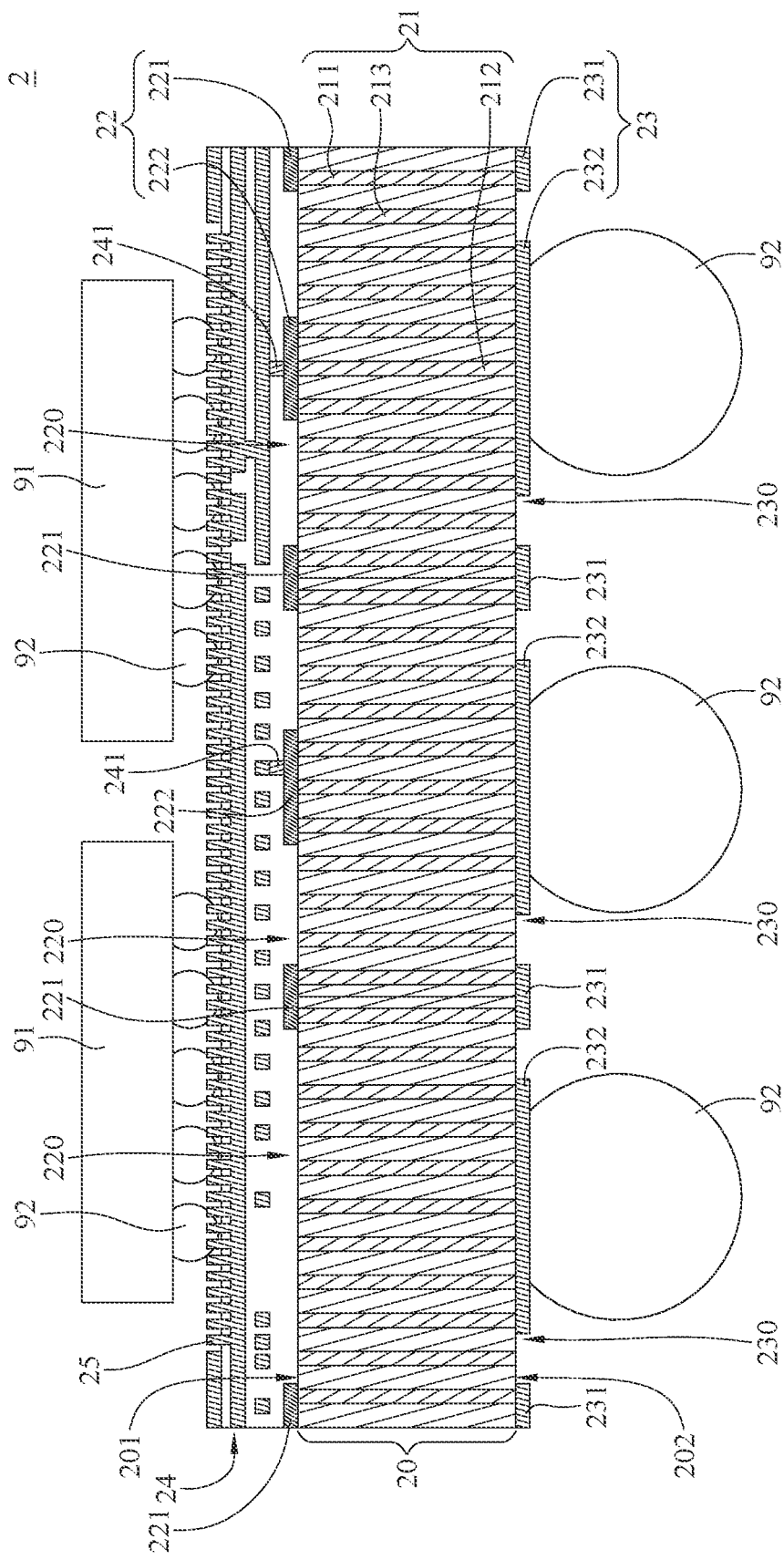
FIG. 3 illustrates a schematic cross-sectional view of an electronic device having a substrate according to another embodiment of the disclosure.

Please refer to FIG. 3. FIG. 3 illustrates a schematic cross-sectional view of an electronic device having a substrate according to another embodiment of the disclosure.

As shown in FIG. 3, in the embodiment, the electronic device 2 includes a substrate 20, an upper conductive layer 22, a lower conductive layer 23, an upper outer layer 24, and a plurality of upper external bumps 25. The substrate 20 has a plurality of inner vias 21. The inner vias 21 include a plurality of ground vias 211, a plurality of signal vias 212, and a plurality of floating vias 213. The floating vias 213 are electrically insulated from the upper conductive layer 22 and the lower conductive layer 23 and electrically floating.

The substrate 20 has an upper surface 201 and a lower surface 202. The upper conductive layer 22 includes an upper ground trace 221 and a plurality of upper signal pads 222. The upper ground trace 221 is disposed on the upper surface 201. The upper ground trace 221 is electrically connected to the ground vias 211. The upper ground trace 221 has a plurality of upper hollow portions 220 and presents a mesh shape. A number of the upper signal pads 222 is smaller than a number of the upper hollow portions 220. Each of the upper signal pads 222 is disposed on a part of the upper surface 201 surface exposed by each of the upper hollow portions 220. Therefore, a part of the upper surface 201 exposed by at least one of the upper hollow portions 220 is absent of the upper signal pads 222. Each of the upper signal pads 222 is electrically connected to more than one of the signal vias 212 in a one-to-plurality manner. The upper signal pads 222 are separated from the upper ground trace 221, and thus the upper signal pads 222 are electrically insulated from the upper ground trace 221. The upper hollow portions 220 expose the floating vias 213.

The lower conductive layer 23 includes a lower ground trace 231 and a plurality of lower signal pads 232. The lower ground trace 231 is disposed on the lower surface 202. The lower ground trace 231 is electrically connected to the ground vias 211. The lower ground trace 231 has a plurality of lower hollow portions 230 and presents a mesh shape. A number of the lower signal pads 232 is the same as a number of the lower hollow portions 230. Each of the lower signal pads 232 is disposed on a part of the lower surface 202 exposed by each of the lower hollow portions 230. Each of the lower signal pads 232 is electrically connected to more than one of the signal vias 212 in a one-to-plurality manner. The lower signal pads 232 are separated from the lower ground trace 231, and thus the lower signal pads 232 are electrically insulated from the lower ground trace 231. The lower hollow portions 230 expose the floating vias 213.

In the embodiment, a shape-and-size of the upper hollow portions 220 is the same as a shape-and-size of the lower hollow portions 230. All of the ground vias 211 are electrically connected to the upper ground trace 221 and the lower ground trace 231. A shape-and-size of the upper signal pads 222 is different from a shape-and-size of the lower signal pads 232. Some of the signal vias 212 are electrically connected to the upper signal pads 222 and the lower signal pads 232 at the same time, and the others of the signal vias 212 are only electrically connected to the lower signal pads 232.

In the embodiment, the upper outer layer 24 has a plurality of upper outer vias 241. The upper outer layer 24 covers the upper conductive layer 22 and the substrate 20. Each of the upper outer vias 241 is electrically connected to each of the upper signal pads 222. The upper external bumps 25 are disposed on the upper outer layer 24. The upper external bumps 25 are electrically connected to the upper outer vias 241.

As shown in FIG. 3, some chips 91 may be electrically connected to the upper external bumps 25 of the electronic device 2 through some solders 92. The lower signal pads 232 of the electronic device 2 may be electrically connected to other electrical component through some solders 92.

Figure 4:
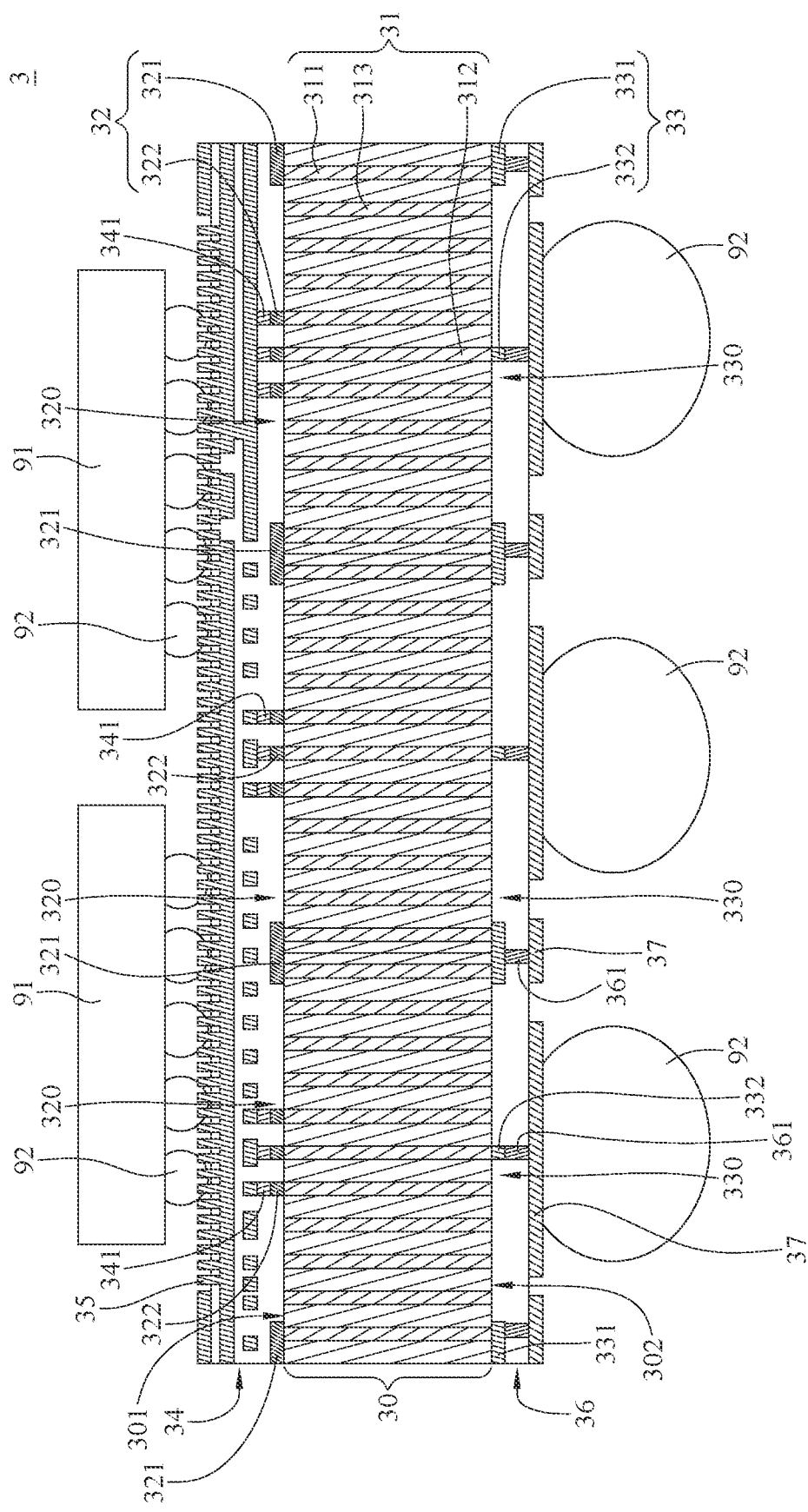
FIG. 4 illustrates a schematic cross-sectional view of an electronic device having a substrate according to another embodiment of the disclosure.

Please refer to FIG. 4. FIG. 4 illustrates a schematic cross-sectional view of an electronic device having a substrate according to another embodiment of the disclosure.

As shown in FIG. 4, in the embodiment, the electronic device 3 includes a substrate 30, an upper conductive layer 32, a lower conductive layer 33, an upper outer layer 34, a plurality of upper external bumps 35, a lower outer layer 36, and a plurality of lower external bumps 37. The substrate 30 has a plurality of inner vias 31. The inner vias 31 include a plurality of ground vias 311, a plurality of signal vias 312, and a plurality of floating vias 313. The floating vias 313 are electrically insulated from the upper conductive layer 32 and the lower conductive layer 33 and electrically floating.

The substrate 30 has an upper surface 301 and a lower surface 302. The upper conductive layer 32 includes an upper ground trace 321 and a plurality of upper signal pads 322. The upper ground trace 321 is disposed on the upper surface 301. The upper ground trace 321 is electrically connected to the ground vias 311. The upper ground trace 321 has a plurality of upper hollow portions 320 and presents a mesh shape. A number of the upper signal pads 322 is three time a number of the upper hollow portions 320. Three of the upper signal pads 322 are disposed on a part of the upper surface 301 exposed by one of the upper hollow portions 320. Each of the upper signal pads 322 is electrically connected to each of the signal vias 312 in a one-to-one manner. The upper signal pads 322 are separated from the upper ground trace 321, and thus the upper signal pads 322 are electrically insulated from the upper ground trace 321. The upper hollow portions 320 expose the floating vias 313.

The lower conductive layer 33 includes a lower ground trace 331 and a plurality of lower signal pads 332. The lower ground trace 331 is disposed on the lower surface 302. The lower ground trace 331 is electrically connected to the ground vias 311. The lower ground trace 331 has a plurality of lower hollow portions 330 and presents a mesh shape. A number of the lower signal pads 332 is the same as a number of the lower hollow portions 330. Each of the lower signal pads 332 is disposed on a part of the lower surface 302 exposed by each of the lower hollow portions 330. Each of the lower signal pads 332 is electrically connected to each of the signal vias 312 in a one-to-one manner. The lower signal pads 332 are separated from the lower ground trace 331, and thus the lower signal pads 332 are electrically insulated from the lower ground trace 331. The lower hollow portions 330 expose the floating vias 313.

In the embodiment, a shape-and-size of the upper hollow portions 320 is the same as a shape-and-size of the lower hollow portions 330. All of the ground vias 311 are electrically connected to the upper ground trace 321 and the lower ground trace 331. The number of the upper signal pads 322 is different from the number of the lower signal pads 332. Some of the signal vias 312 are electrically connected to the upper signal pads 322 and the lower signal pads 332 at the same time, and the others of the signal vias 312 are only electrically connected to the upper signal pads 322.

In the embodiment, the upper outer layer 34 has a plurality of upper outer vias 341. The upper outer layer 34 covers the upper conductive layer 32 and the substrate 30. Each of the upper outer vias 341 is electrically connected to each of the upper signal pads 322. The upper external bumps 35 are disposed on the upper outer layer 34. The upper external bumps 35 are electrically connected to the upper outer vias 341.

The lower outer layer 36 has a plurality of lower outer vias 361. The lower outer layer 36 covers the lower conductive layer 33 and the substrate 30. Each of the lower outer vias 361 is electrically connected to each of the lower signal pads 332. The lower external bumps 37 are disposed on the lower outer layer 36. Each of the lower external bumps 37 is electrically connected to each of the lower outer vias 361.

As shown in FIG. 4, some chips 91 may be electrically connected to the upper external bumps 35 of the electronic device 3 through some solders 92. The lower external bumps 37 of the electronic device 3 may be electrically connected to other electrical component through some solders 92.

Figure 5:
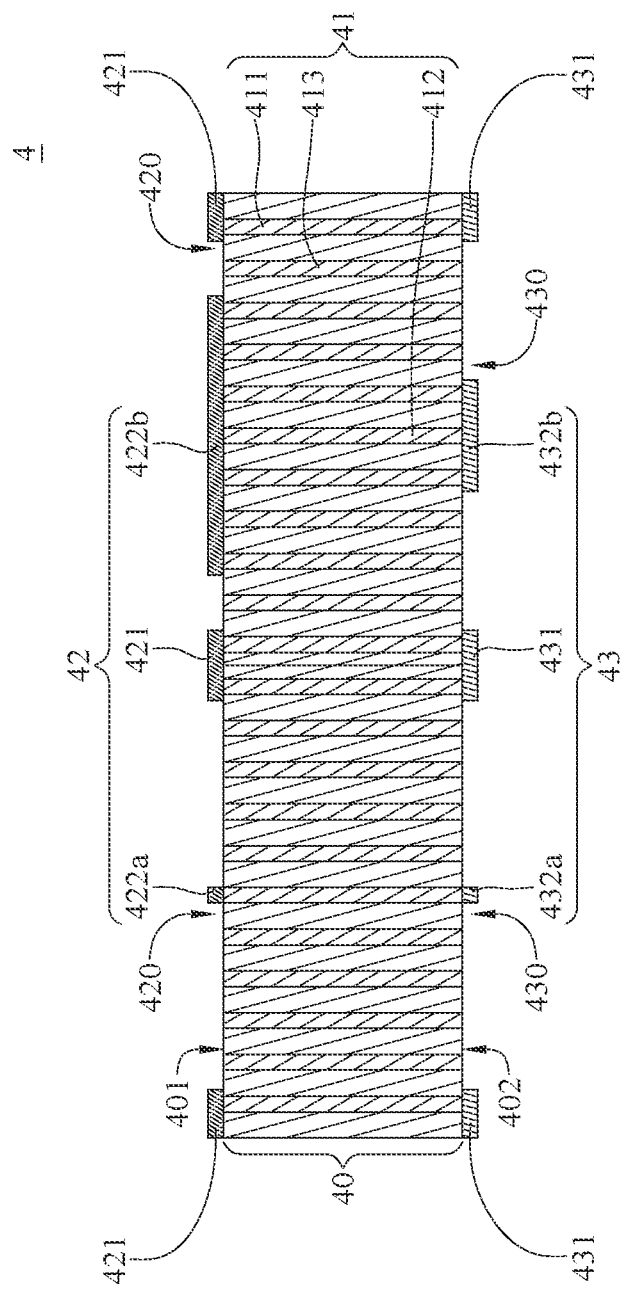
FIG. 5 illustrates a schematic cross-sectional view of an electronic device having a substrate according to another embodiment of the disclosure.

Please refer to FIG. 5. FIG. 5 illustrates a schematic cross-sectional view of an electronic device having a substrate according to another embodiment of the disclosure.

As shown in FIG. 5, in the embodiment, the electronic device 4 includes a substrate 40, an upper conductive layer 42, and a lower conductive layer 43. The substrate 40 has a plurality of inner vias 41. The inner vias 41 include a plurality of ground vias 411, a plurality of signal vias 412, and a plurality of floating vias 413. The floating vias 413 are electrically insulated from the upper conductive layer 42 and the lower conductive layer 43 and electrically floating.

The substrate 40 has an upper surface 401 and a lower surface 402. The upper conductive layer 42 includes an upper ground trace 421, an upper signal pad 422a, and an upper signal pad 422b. The upper ground trace 421 is disposed on the upper surface 401. The upper ground trace 421 is electrically connected to the ground vias 411. The upper ground trace 421 has a plurality of upper hollow portions 420 and presents a mesh shape. The upper signal pad 422a and the upper signal pad 422b have a variety of different sizes or shapes. The upper signal pad 422a is disposed on a part of the upper surface 401 exposed by one of the upper hollow portions 420. The upper signal pad 422a is electrically connected to one of the signal vias 412 in a one-to-one manner. The upper signal pad 422b is disposed on a part of the upper surface 401 exposed by another of the upper hollow portions 420. The upper signal pad 422b is electrically connected to more than one of the signal vias 412 in a one-to-plurality manner. Both of the upper signal pad 422a and the upper signal pad 422b are separated from the upper ground trace 421, and thus both of the upper signal pad 422a and the upper signal pad 422b are electrically insulated from the upper ground trace 421. The upper hollow portions 420 expose the floating vias 413.

The lower conductive layer 43 includes a lower ground trace 431, a lower signal pad 432a, and a lower signal pad 432b. The lower ground trace 431 is disposed on the lower surface 402. The lower ground trace 431 is electrically connected to the ground vias 411. The lower ground trace 431 has a plurality of lower hollow portions 430 and presents a mesh shape. The lower signal pad 432a and the lower signal pad 432b have a variety of different sizes or shapes. The lower signal pad 432a is disposed on a part of the lower surface 402 exposed by one of the lower hollow portions 430. The lower signal pad 432a is electrically connected to one of the signal vias 412 in a one-to-one manner. The lower signal pad 432b is disposed on a part of the lower surface 402 exposed by another of the lower hollow portions 430. The lower signal pad 432b is electrically connected to more than one of the signal vias 412 in a one-to-plurality manner. Both of the lower signal pad 432a and the lower signal pad 432b are separated from the lower ground trace 431, and thus both of the lower signal pad 432a and the lower signal pad 432b are electrically insulated from the lower ground trace 431. The lower hollow portions 430 expose the floating vias 413.

In the embodiment, a shape-and-size of the upper hollow portions 420 is the same as a shape-and-size of the lower hollow portions 430. All of the ground vias 411 are electrically connected to the upper ground trace 421 and the lower ground trace 431. A shape-and-size of the upper signal pad 422b is different from a shape-and-size of the lower signal pad 432b. One of the signal vias 412 is electrically connected to the upper signal pad 422a and the lower signal pad 432a at the same time, others of the signal vias 412 are electrically connected to the upper signal pad 422b and the lower signal pad 432b at the same time, and the others of the signal vias 412 are only electrically connected to the upper signal pad 422b.

All of the embodiments in FIG. 6 to FIG. 10 describe electronic devices that are symmetrical up and down. Hereinafter, the electronic device will be described with a top view, and the description of the elements on the lower side of the electronic device may be omitted.

Figure 6:
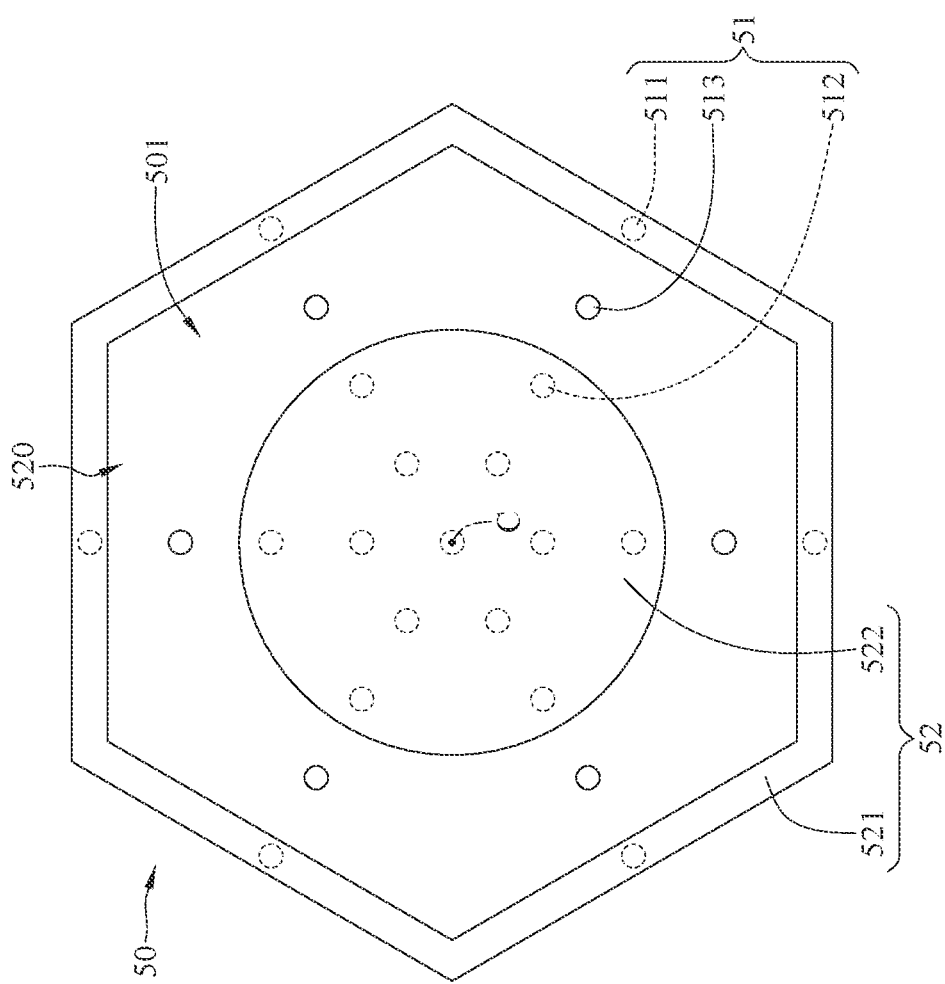
FIG. 6 illustrates a schematic top view of an electronic device having a substrate according to another embodiment of the disclosure.

Please refer to FIG. 6. FIG. 6 illustrates a schematic top view of an electronic device having a substrate according to another embodiment of the disclosure.

As shown in FIG. 6, in the embodiment, the electronic device 5 includes a substrate 50 and an upper conductive layer 52. The substrate 50 has a plurality of inner vias 51. The inner vias 51 include a plurality of ground vias 511, a plurality of signal vias 512, and a plurality of floating vias 513. The floating vias 513 are electrically insulated from the upper conductive layer 52 and electrically floating.

The upper conductive layer 52 includes an upper ground trace 521 and an upper signal pad 522. The upper ground trace 521 is disposed on an upper surface 501 of the substrate 50. The upper ground trace 521 is electrically connected to the ground vias 511. The upper signal pad 522 is disposed on a part of the upper surface 501 exposed by an upper hollow portion 520 of the upper ground trace 521. The upper signal pad 522 is electrically connected to more than one of the signal vias 512 in a one-to-plurality manner. The upper signal pad 522 is separated from the upper ground trace 521, and thus the upper signal pad 522 is electrically insulated from the upper ground trace 521. The upper hollow portion 520 exposes the floating vias 513.

In the embodiment, the upper hollow portion 520 is in a regular hexagon shape, and the upper signal pad 522 is in a circle shape. The upper hollow portion 520 has a central point C. The inner vias 51 are arranged radially with the central point C and through a middle point of each side of the regular hexagon.

Figure 7:
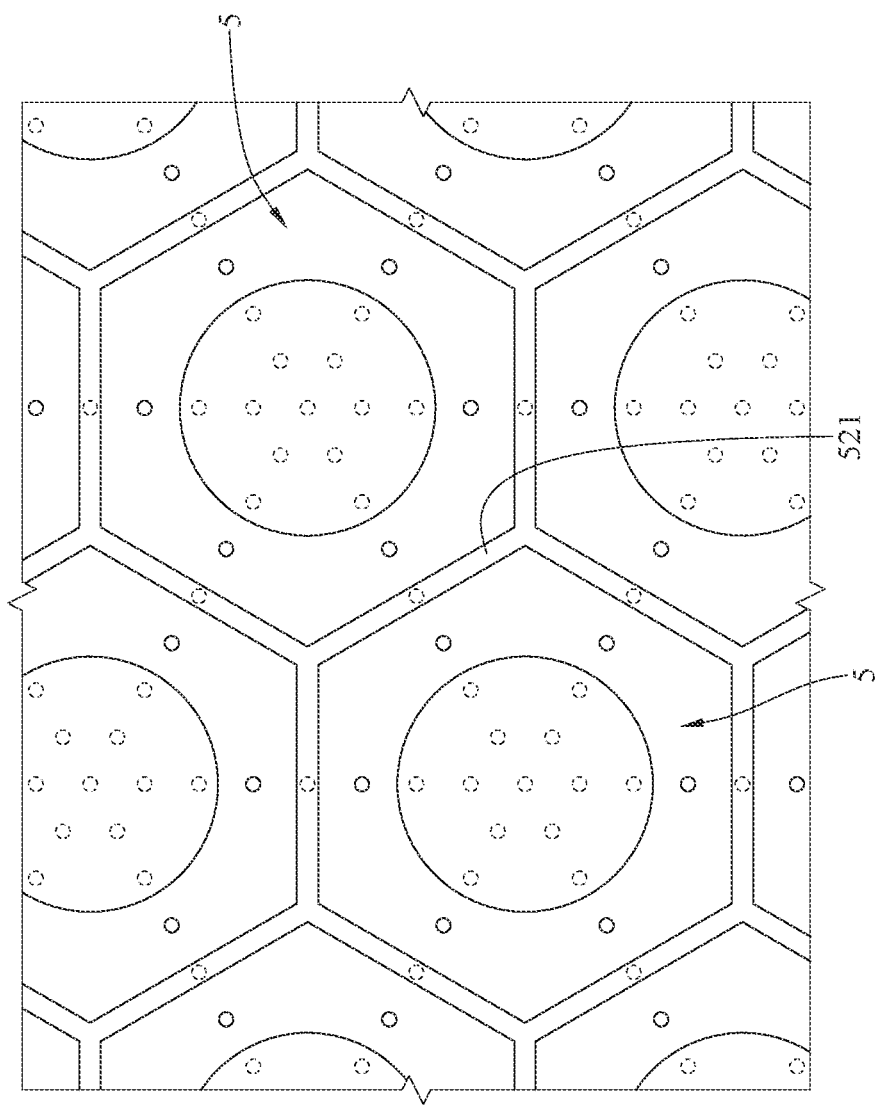
FIG. 7 illustrates a schematic top view of an electronic device having a substrate according to another embodiment of the disclosure.

Please refer to FIG. 7. FIG. 7 illustrates a schematic top view of an electronic device having a substrate according to another embodiment of the disclosure.

As shown in FIG. 7, in the embodiment, the electronic device 5a includes a plurality of the electronic devices 5 shown in FIG. 6. In the embodiment, the electronic devices 5 are arranged in a honeycomb manner and connected to each other. The adjacent electronic devices 5 may share the upper ground traces 521 with each other.

Figure 8:
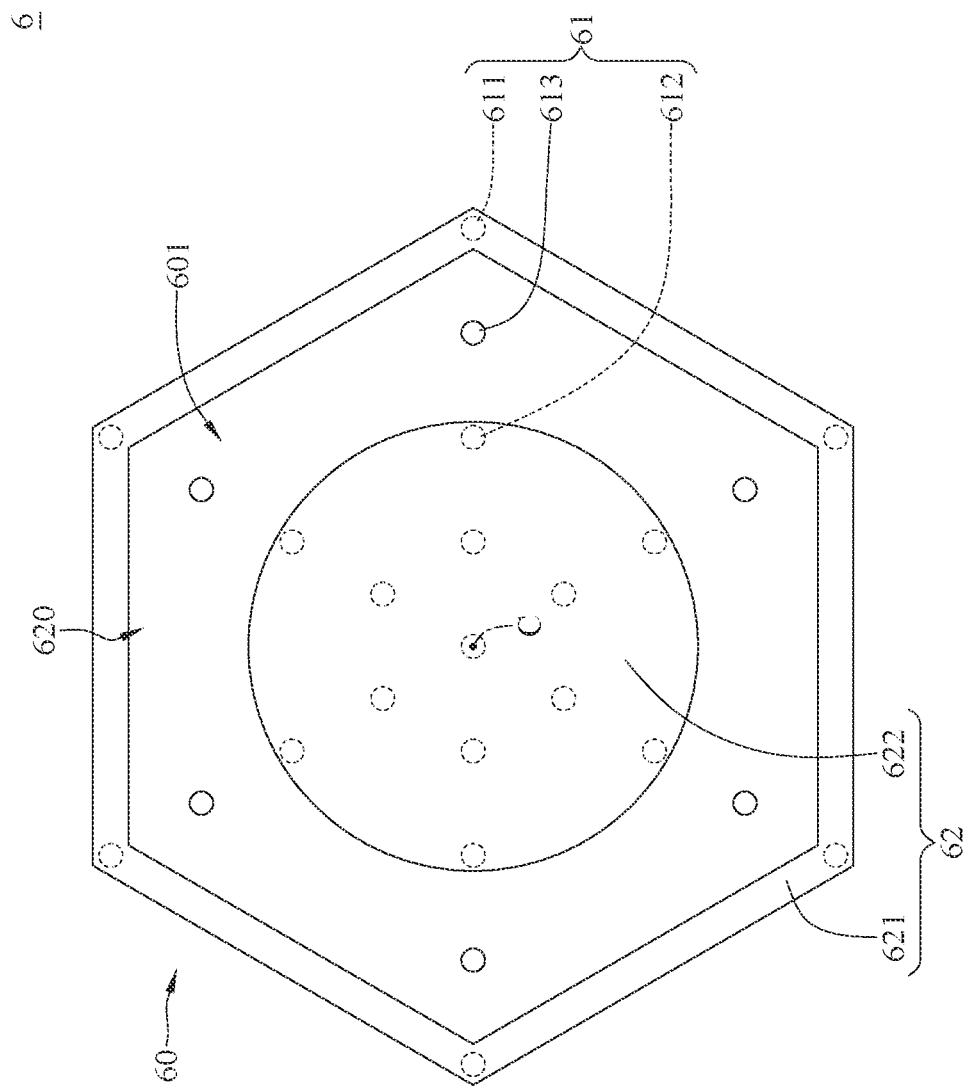
FIG. 8 illustrates a schematic top view of an electronic device having a substrate according to another embodiment of the disclosure.

Please refer to FIG. 8. FIG. 8 illustrates a schematic top view of an electronic device having a substrate according to another embodiment of the disclosure.

As shown in FIG. 8, in the embodiment, the electronic device 6 includes a substrate 60 and an upper conductive layer 62. The substrate 60 has a plurality of inner vias 61. The inner vias 61 include a plurality of ground vias 611, a plurality of signal vias 612, and a plurality of floating vias 613. The floating vias 613 are electrically insulated from the upper conductive layer 62 and electrically floating.

The upper conductive layer 62 includes an upper ground trace 621 and an upper signal pad 622. The upper ground trace 621 is disposed on an upper surface 601 of the substrate 60. The upper ground trace 621 is electrically connected to the ground vias 611. The upper signal pad 622 is disposed on a part of the upper surface 601 exposed by an upper hollow portion 620 of the upper ground trace 621. The upper signal pad 622 is electrically connected to more than one of the signal vias 612 in a one-to-plurality manner. The upper signal pad 622 is separated from the upper ground trace 621, and thus the upper signal pad 622 is electrically insulated from the upper ground trace 621. The upper hollow portion 620 exposes the floating vias 613.

In the embodiment, the upper hollow portion 620 is in a regular hexagon shape, and the upper signal pad 622 is in a circle shape. The upper hollow portion 620 has a central point C. The inner vias 61 are arranged radially with the central point C and through an angular point of each corner of the regular hexagon.

Figure 9:
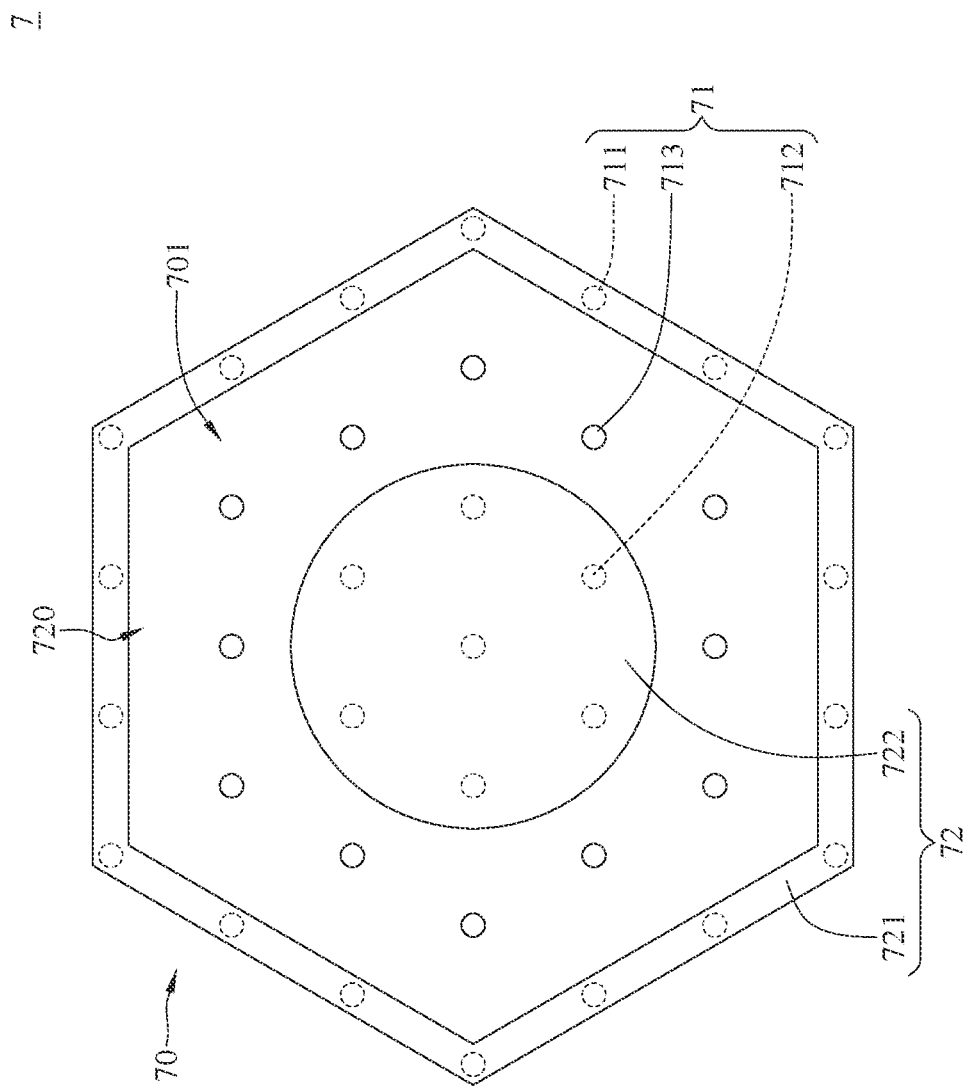
FIG. 9 illustrates a schematic top view of an electronic device having a substrate according to another embodiment of the disclosure.

Please refer to FIG. 9. FIG. 9 illustrates a schematic top view of an electronic device having a substrate according to another embodiment of the disclosure.

As shown in FIG. 9, in the embodiment, the electronic device 7 includes a substrate 70 and an upper conductive layer 72. The substrate 70 has a plurality of inner vias 71. The inner vias 71 include a plurality of ground vias 711, a plurality of signal vias 712, and a plurality of floating vias 713. The floating vias 713 are electrically insulated from the upper conductive layer 72 and electrically floating.

The upper conductive layer 72 includes an upper ground trace 721 and an upper signal pad 722. The upper ground trace 721 is disposed on an upper surface 701 of the substrate 70. The upper ground trace 721 is electrically connected to the ground vias 711. The upper signal pad 722 is disposed on a part of the upper surface 701 exposed by an upper hollow portion 720 of the upper ground trace 721. The upper signal pad 722 is electrically connected to more than one of the signal vias 712 in a one-to-plurality manner. The upper signal pad 722 is separated from the upper ground trace 721, and thus the upper signal pad 722 is electrically insulated from the upper ground trace 721. The upper hollow portion 720 exposes the floating vias 713.

In the embodiment, the upper hollow portion 720 is in a regular hexagon shape, and the upper signal pad 722 is in a circle shape. The inner vias 71 are arranged in a triangular array.

Figure 10:
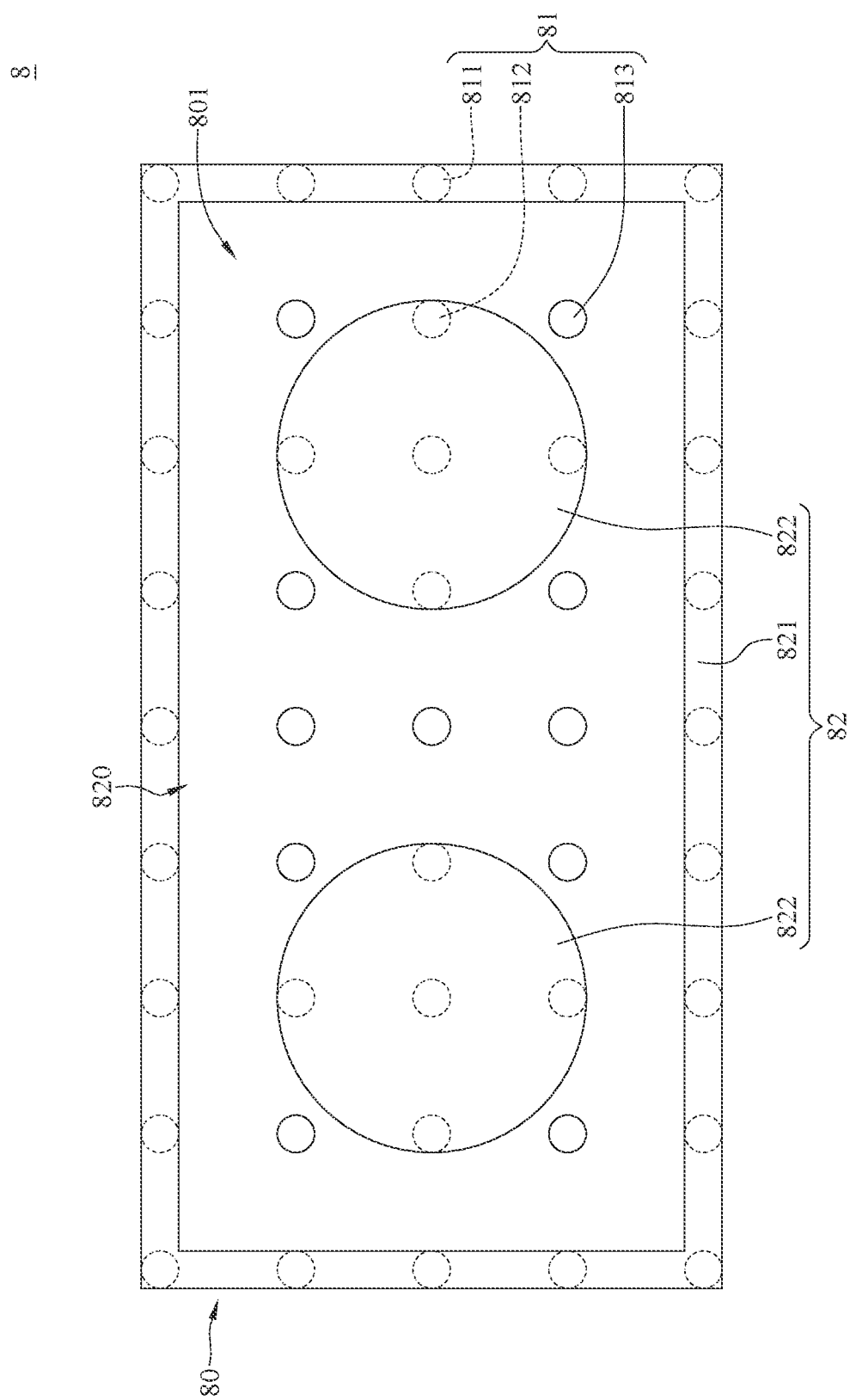
FIG. 10 illustrates a schematic top view of an electronic device having a substrate according to another embodiment of the disclosure.

Please refer to FIG. 10. FIG. 10 illustrates a schematic top view of an electronic device having a substrate according to another embodiment of the disclosure.

As shown in FIG. 10, in the embodiment, the electronic device 8 includes a substrate 80 and an upper conductive layer 82. The substrate 80 has a plurality of inner vias 81. The inner vias 81 include a plurality of ground vias 811, a plurality of signal vias 812, and a plurality of floating vias 813. The floating vias 813 are electrically insulated from the upper conductive layer 82 and electrically floating.

The upper conductive layer 82 includes an upper ground trace 821 and two upper signal pads 822. The upper ground trace 821 is disposed on an upper surface 801 of the substrate 80. The upper ground trace 821 is electrically connected to the ground vias 811. The two upper signal pads 822 are disposed on a part of the upper surface 801 exposed by one upper hollow portion 820 of the upper ground trace 821. The upper hollow portion 820 may be in a rectangular shape. Each of the upper signal pads 822 is electrically connected to more than one of the signal vias 812 in a one-to-plurality manner. The upper signal pads 822 are separated from the upper ground trace 821, and thus the upper signal pads 822 are electrically insulated from the upper ground trace 821. The upper hollow portion 820 exposes the floating vias 813. The two upper signal pads 822 may be used to transmit differential signals.

According to the electronic devices as discussed in the above embodiments of the disclosure, a signal may be transmitted in an up-and-down direction through the upper signal pads, the signal vias, and the lower signal pads. When an electrical component is mounted on the substrate through the upper signal pads or the lower signal pads, the floating vias are electrically insulated from the upper conductive layer and the lower conductive layer and electrically floating, which can make the impedance of the electronic device is matched with the electrical component to reduce the amount of signal reflection during signal transmission, thereby reducing signal distortion and attenuation.

Although the disclosure is disclosed in the foregoing embodiments, it is not intended to limit the disclosure. All variations and modifications made without departing from the spirit and scope of the disclosure fall within the scope of the disclosure. For the scope defined by the disclosure, please refer to the attached claims.

What is claimed is:

1. An electronic device, comprising:
   a substrate, having a plurality of inner vias, wherein the inner vias comprise a plurality of ground vias, at least one signal via, and a plurality of floating vias, and the substrate has an upper surface and a lower surface;
   an upper conductive layer, comprises:
      an upper ground trace, disposed on the upper surface, wherein the upper ground trace is electrically connected to at least one ground via of the plurality of the ground vias, the upper ground trace has at least one upper hollow portion, and the at least one upper hollow portion exposes a part of the upper surface; and
      at least one upper signal pad, disposed on the part of the upper surface exposed by the at least one upper hollow portion, wherein the at least one upper signal pad is electrically connected to the at least one signal via;
   a lower conductive layer, comprises:
      a lower ground trace, disposed on the lower surface, wherein the lower ground trace is electrically connected to at least one ground via of the plurality of the ground vias, the lower ground trace has at least one lower hollow portion, and the at least one lower hollow portion exposes a part of the lower surface; and
      at least one lower signal pad, disposed on the part of the lower surface exposed by the at least one lower hollow portion, wherein the at least one lower signal pad is electrically connected to the at least one signal via; and
   an upper outer layer, having at least one upper outer via, wherein the upper outer layer covers the upper conductive layer and the substrate, and the at least one upper outer via is electrically connected to the at least one upper signal pad;
   wherein the floating vias are electrically insulated from the upper conductive layer and the lower conductive layer and electrically floating.

2. The electronic device according to claim 1, wherein a number of the at least one upper hollow portion, a number of the at least one lower hollow portion, and a number of the at least one lower signal pad are plural, respectively, and a part of the upper surface exposed by at least one of the upper hollow portions is absent of the at least one upper signal pad.

3. The electronic device according to claim 1, further comprising a lower outer layer, having at least one lower outer via, wherein the lower outer layer covers the lower conductive layer and the substrate, and the at least one lower outer via is electrically connected to the at least one lower signal pad.

4. The electronic device according to claim 3, further comprising at least one upper external bump and at least one lower external bump, wherein the at least one upper external bump is disposed on the upper outer layer, the at least one upper external bump is electrically connected to the at least one upper outer via, the at least one lower external bump is disposed on the lower outer layer, and the at least one lower external bump is electrically connected to the at least one lower outer via.

5. The electronic device according to claim 1, wherein a shape-and-size of the at least one upper hollow portion is the same as a shape-and-size of the at least one lower hollow portion, and all of the ground vias electrically connect the upper ground trace and the lower ground trace.

6. The electronic device according to claim 1, wherein a shape-and-size of the at least one upper signal pad is the same as a shape-and-size of the at least one lower signal pad, a number of the at least one signal via is plural, and all of the signal vias electrically connect the at least one upper signal pad and the at least one lower signal pad.

7. The electronic device according to claim 1, wherein a shape or a size of the at least one upper signal pad is different from a shape or a size of the at least one lower signal pad, a number of the at least one signal via is plural, at least one of the signal vias is electrically connected to both of the at least one upper signal pad and the at least one lower signal pad, and at least another one of the signal vias is merely electrically connected to one of the at least one upper signal pad and the at least one lower signal pad.

8. The electronic device according to claim 1, wherein a number of the at least one upper signal pad, a number of the at least one upper hollow portion, a number of the at least one lower signal pad, and a number of the at least one lower hollow portion are all plural, the upper signal pads are disposed on the parts of the upper surface exposed by the upper hollow portions, respectively, the upper signal pads have different sizes or shapes, the lower signal pads are disposed on the parts of the lower surface exposed by the lower hollow portions, respectively, and the lower signal pads have different sizes or shapes.

9. The electronic device according to claim 1, wherein the inner vias are arranged in an array.

10. The electronic device according to claim 1, wherein a shape of the at least one upper hollow portion or a shape of the at least one lower hollow portion is a regular hexagon and has a central point, and the inner vias are arranged radially with the central point and through a middle point of each side of the regular hexagon or an angular point of each corner of the regular hexagon.

11. The electronic device according to claim 1, wherein a number of the at least one upper signal pad, a number of the at least one lower signal pad, and a number of the at least one signal via are all plural, a number of the at least one upper hollow portion and a number of the at least one lower hollow portion are both one, the upper signal pads are disposed on the part of the upper surface exposed by the upper hollow portion, the lower signal pads are disposed on the part of the lower surface exposed by the lower hollow portion, and each of the upper signal pads is electrically connected to each of the lower signal pads through at least one of the signal vias.

12. The electronic device according to claim 1, wherein a shape of the at least one upper hollow portion and a shape of the at least one lower hollow portion are rectangles or regular hexagons.

13. The electronic device according to claim 1, wherein a shape of the at least one upper signal pad and a shape of the at least one lower signal pad are circles.

14. The electronic device according to claim 1, wherein each of the inner vias is solid.

15. The electronic device according to claim 1, wherein a number of the at least one signal via is plural, and the at least one upper signal pad or the at least one lower signal pad is electrically connected to the signal vias in a one-to-plurality manner.

16. The electronic device according to claim 1, wherein each of the inner vias has an outer diameter ranging from 5 μm to 100 μm.

17. The electronic device according to claim 1, wherein a center distance between every two inner vias adjacent to each other is in micrometer scale.

18. The electronic device according to claim 1, wherein the substrate comprises a core layer made of a material selected from a group consisting of a semiconductor material and a non-conductive material.

19. The electronic device according to claim 1, wherein the substrate comprises a core layer made of a material selected from a group consisting of silicon, gallium, germanium, gallium nitride, and epoxy resin.

* * * * *